(12) United States Patent
Uchikawa et al.

(10) Patent No.: US 8,966,351 B2
(45) Date of Patent: Feb. 24, 2015

(54) ENCODING APPARATUS, ENCODING METHOD AND SEMICONDUCTOR MEMORY SYSTEM

(71) Applicants: Hironori Uchikawa, Fujisawa (JP); Haruka Obata, Tokyo (JP)

(72) Inventors: Hironori Uchikawa, Fujisawa (JP); Haruka Obata, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 13/706,663

(22) Filed: Dec. 6, 2012

(65) Prior Publication Data
US 2013/0151921 A1 Jun. 13, 2013

(30) Foreign Application Priority Data

Dec. 13, 2011 (JP) ................................. 2011-272624

(51) Int. Cl.
*H03M 13/00* (2006.01)
*H03M 13/13* (2006.01)
*H03M 13/11* (2006.01)

(52) U.S. Cl.
CPC ............ *H03M 13/13* (2013.01); *H03M 13/116* (2013.01); *H03M 13/118* (2013.01); *H03M 13/611* (2013.01)
USPC ............................. 714/781; 714/755; 714/786

(58) Field of Classification Search
CPC ............ H03M 13/13; H03M 13/1515; H03M 13/1575; H03M 13/158; H03M 13/616; H03M 13/116; H03M 13/118; H03M 13/611; G06F 11/10; G06F 11/1076; G06F 11/1044; H04L 1/0057; H04L 1/0083
USPC .......... 714/752, E11.034, 781, E11.032, 759, 714/761, 763, 767, 770, 773, 755, 786; 375/341; 455/63.1
See application file for complete search history.

(56) References Cited

U.S. PATENT DOCUMENTS

| | | | | |
|---|---|---|---|---|
| 4,512,020 A | * | 4/1985 | Krol et al. | 714/781 |
| 7,487,425 B1 | * | 2/2009 | Chen | 714/752 |
| 2006/0218470 A1 | * | 9/2006 | Dickson | 714/767 |

(Continued)

FOREIGN PATENT DOCUMENTS

| | | |
|---|---|---|
| JP | 2007503755 A | 2/2007 |
| WO | 2005069492 A1 | 7/2005 |

OTHER PUBLICATIONS

Thomas J. Richardson et al; Efficient Encoding of Low-Density Parity-Check Codes; IEEE Transactions on Information Theory; vol. 47, No. 2, Feb. 2001; pp. 638-656.

M. Hagiwara et al; Quantum Quasi-Cyclic LDPC Codes; ISIT; 2007; pp. 806-810.

(Continued)

*Primary Examiner* — Guy Lamarre
(74) *Attorney, Agent, or Firm* — Holtz, Holtz, Goodman & Chick PC

(57) ABSTRACT

According to one embodiment, an encoding apparatus includes an input unit and a generation unit. The input unit inputs a data symbol sequence containing q(N−J) symbols (q, J, and N are integers, N>J). The generation unit generates a codeword containing qN symbols by adding a parity symbol sequence containing qJ symbols to the data symbol sequence. The codeword satisfies parity check equations of a parity check matrix of qJ rows×qN columns. A first submatrix of qJ rows×qJ columns that corresponds to the parity symbol sequence in the parity check matrix includes a second submatrix. The second submatrix includes a first identity matrix of qL rows×qL columns (L is an integer, J>L) and a first non-zero matrix of q(J−L) rows×qL columns.

11 Claims, 4 Drawing Sheets

Parity check matrix H

Fundamental matrix $\Omega_H$

(56) References Cited

U.S. PATENT DOCUMENTS

| | | |
|---|---|---|
| 2007/0186140 A1 | 8/2007 | Senda |
| 2010/0287593 A1* | 11/2010 | Sayadi et al. ............ 725/62 |
| 2011/0167315 A1 | 7/2011 | Kyung et al. |
| 2013/0254628 A1* | 9/2013 | Kim et al. .............. 714/773 |

OTHER PUBLICATIONS

Japanese Office Action dated Aug. 19, 2014 issued in counterpart Japanese Application No. 2011-272624.

* cited by examiner $$
\begin{bmatrix}
\infty & \infty & 0 & 0 & 0 \\
\infty & 0 & \infty & 1 & 0 \\
0 & \infty & \infty & 2 & 0 \\
0 & 2 & 1 & \infty & 1 \\
0 & 1 & \infty & 0 & 2 \\
0 & 0 & 1 & 0 & \infty
\end{bmatrix}
$$

Fundamental matrix $\Omega_H$

Parity check matrix $H$

FIG. 4

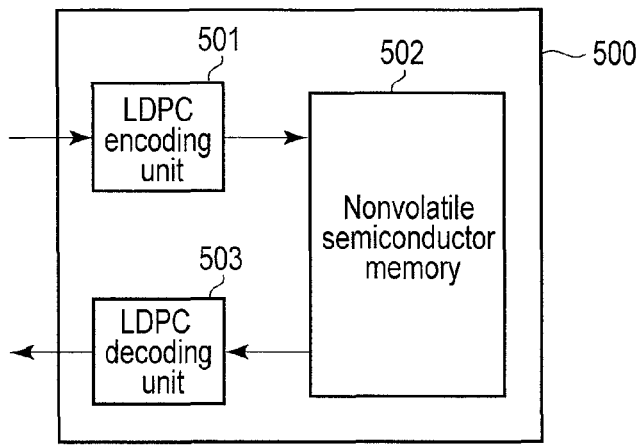
F I G. 5
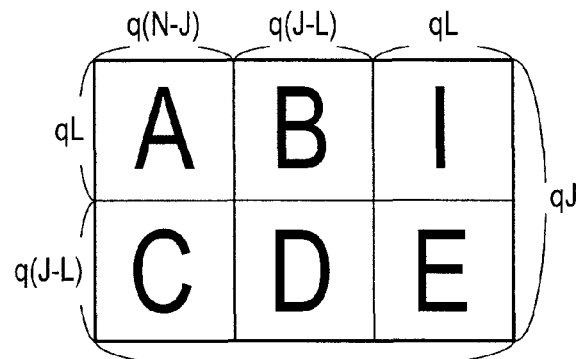
F I G. 6
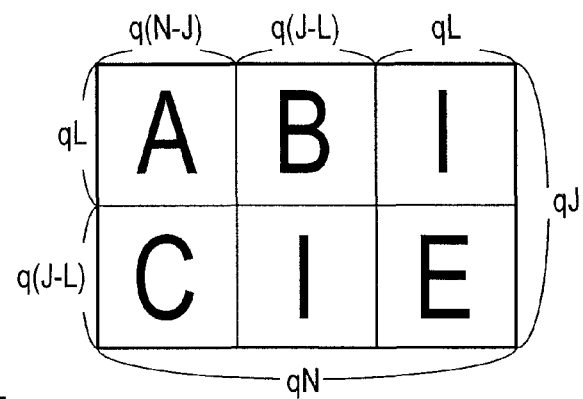
F I G. 7

FIG. 8

ENCODING APPARATUS, ENCODING METHOD AND SEMICONDUCTOR MEMORY SYSTEM

CROSS-REFERENCE TO RELATED APPLICATIONS

This application is based upon and claims the benefit of priority from Japanese Patent Application No. 2011-272624, filed Dec. 13, 2011, the entire contents of which are incorporated herein by reference.

FIELD

Embodiments described herein relate generally to error correction coding.

BACKGROUND

As a method of error correction coding with strong error correction performance, low-density parity check (LDPC) coding is known. LDPC codewords can be decoded based on, for example, message passing algorithm. Calculation complexity of such a decoding process can be evaluated as order O(n) for a code length (n symbols), i.e., a linear order. On the other hand, an encoding process to generate LDPC codewords can be generally realized by multiplying a data symbol sequence (data vector) with a generator matrix. Calculation complexity of such an encoding process can be evaluated as order $O(n^2)$ for a code length (n symbols).

BRIEF DESCRIPTION OF THE DRAWINGS

FIG. 4 is an explanatory drawing showing a relationship between a semi-cyclic shift matrix and a fundamental matrix.

FIG. 5 is a block diagram showing a semiconductor memory system according to the third embodiment.

FIG. 6 is a drawing showing a parity check matrix corresponding to the encoding apparatus according to the first embodiment.

FIG. 7 is a drawing showing a parity check matrix corresponding to the encoding apparatus according to the second embodiment.

FIG. 8 is a drawing showing a fundamental matrix of the parity check matrix corresponding to the encoding apparatus according to the second embodiment.

DETAILED DESCRIPTION

Figure 1:
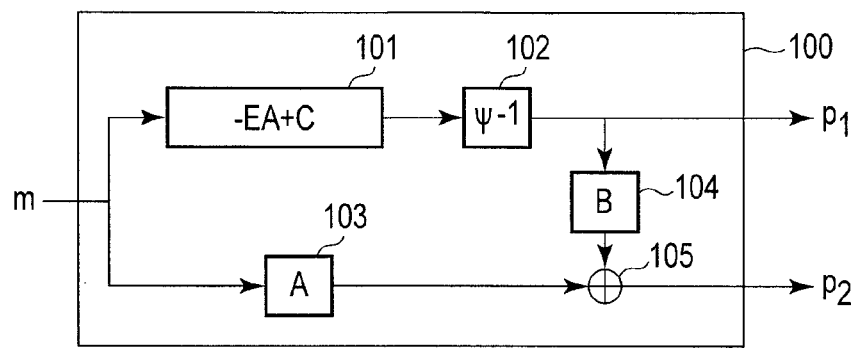
FIG. 1 is a block diagram showing an encoding apparatus according to the first embodiment.

In the following, the embodiments will be explained with reference to the drawings.

In general, according to one embodiment, an encoding apparatus includes an input unit and a generation unit. The input unit inputs a data symbol sequence containing q(N−J) symbols (q, J, and N are integers, N>J). The generation unit generates a codeword containing qN symbols by adding a parity symbol sequence containing qJ symbols to the data symbol sequence. The codeword satisfies parity check equations of a parity check matrix of qJ rows×qN columns. A first submatrix of qJ rows×qJ columns that corresponds to the parity symbol sequence in the parity check matrix includes a second submatrix. The second submarix includes a first identity matrix of qL rows×qL columns (L is an integer, J>L) and a first non-zero matrix of q(J−L) rows×qL columns.

In the following, the same elements are denoted by the same respective reference numbers. Redundant explanation will be avoided.

In the following explanation, each embodiment is assumed to be applied to, but not limited to, an LDPC coding scheme.

The characteristics of a parity check matrix does not change if elementary row operation and elementary column operation are performed on the parity check matrix. Thus, in the following explanation, a second parity check matrix that can be derived by performing at least one of elementary row operation and elementary column operation on a first parity check matrix is considered to be the same as the first parity check matrix.

In the following explanation, for simplicity, it is assumed that each embodiment is applied to binary symbols (the symbol value is 1 or 0). Accordingly, a sign can be neglected when calculating symbols. However, if the embodiments are applied to non-binary symbols, a sign cannot be neglected when the symbols are calculated.

(First Embodiment)

Encoding can be defined as a process of generating a parity symbol sequence (parity vector) p having a length of r=qJ that satisfies Equation (1) below with respect to a data symbol sequence m having a length of f=q(N−J). In the following explanation, t is a symbol indicating transposition of a matrix or vector.

$$H(m, p)^t = 0 \quad (1)$$

In Equation (1), H represents a parity check matrix. A general LDPC encoding process can be realized by multiplying a generator matrix corresponding to the parity check matrix H with a data symbol sequence m. The calculation complexity of the process is order $O(n^2)$ is as described above. Herein, it is possible to reduce the calculation complexity by generating a parity symbol sequence p, using the parity check matrix H.

More specifically, as shown in Equation (2) below, the parity check matrix H consists of six (sub) matrices A, B, T, C, D and E. Matrix T is a lower triangular matrix. Although other matrices A, B, C, D and E are not necessarily lower triangular matrices, in light of reducing of calculation complexity, preferably they are sparse matrices.

$$H = \begin{pmatrix} A & B & T \\ C & D & E \end{pmatrix} \quad (2)$$

Matrices A and C correspond to the data symbol sequence m (in other words, matrices A and C are multiplied with the data symbol sequence m). Matrices B, T, D and E correspond to the parity symbol sequence p (in other words, matrices B, T, D and E are multiplied with the parity symbol sequence p). More specifically, if the parity symbols p is divided as in $p=(p_1, p_2)$, matrices B and D correspond to the first (sub) parity symbol sequence $p_1$ (i.e., the first (sub) parity vector), and matrices T and E correspond to the second (sub) parity symbol sequence $p_2$ (i.e., the second (sub) parity vector). If the length of the first parity symbol sequence $p_1$ is $r_1=q(J-L)$ and the length of the second parity symbol sequence $p_2$ is $r_2=qL$, the relationship $r=r1+r2$ holds true. If elementary row operation is performed on the parity check matrix H in Equation (2) to replace matrix E with a zero matrix, the parity check matrix H' as shown in Equation (3) below can be obtained. In the following explanation, −1 is a symbol for indicating an inverse matrix.

$$H' = \begin{pmatrix} I & 0 \\ -ET^{-1} & I \end{pmatrix} \begin{pmatrix} A & B & T \\ C & D & E \end{pmatrix} = \begin{pmatrix} A & B & T \\ -ET^{-1}A+C & -ET^{-1}B+D & 0 \end{pmatrix} \quad (3)$$

It should be noted that matrix T is a lower triangular matrix, an inverse matrix $T^{-1}$ exists. Even if elementary row operation is performed, the characteristic of the parity check matrix H does not change; thus, H'(m, p)$^t$=0 holds true. In other words, Equations (4) and (5) below hold true.

$$Am^t + Bp_1^t + Tp_2^t = 0 \quad (4)$$

$$(-ET^{-1}A+C)m^t + (-ET^{-1}B+D)p_1^t = 0 \quad (5)$$

From Equation (5), the first parity symbol sequence $p_1$ can be generated as shown in Equation (6) below:

$$p_1^t = -(-ET^{-1}B+D)^{-1}(-ET^{-1}A+C)m^t = -\Phi^{-1}(-ET^{-1}A+C)m^t \quad (6)$$

From Equation (4), the second parity symbol sequence $p_2$ can be generated as shown in Equation (7) below:

$$p_2^t = -T^{-1}(Am^t + Bp_1^t) \quad (7)$$

In Equation (7), if matrices A and B are sparse matrices, calculation complexity of matrix products $Am^t$ and $Bp_1^t$ will be low. Furthermore, since T is a lower triangular matrix, if each element in the second parity symbol sequence $p_2$ is sequentially calculated, calculation complexity can be reduced. Accordingly, if the parity symbol sequence p is generated in such a manner, calculation complexity of the encoding process can be partially reduced.

On the other hand, as such a method of generating a parity symbol sequence includes sequential calculation, it is difficult to perform parallel processing; in other words, it is difficult to increase the processing rate of such a generation method. Furthermore, generally speaking, a matrix $\phi^{-1}$ in Equation (6) is not a sparse matrix. For this reason, if such a generating method is adopted, the calculation complexity in generation of the first parity symbol sequence is not always low.

If matrix T is replaced with identity matrix I having the same size, Equations (6) and (7) can be replaced with Equations (8) and (9) below. As stated above, plus and minus signs can be switched with respect to a binary symbol; thus, the minus sign on the right side can be changed to a plus sign.

$$p_1^t = -(-EB+D)^{-1}(-EA+C)m^T = -\Psi^{-1}(-EA+C)m^t \quad (8)$$

$$p_2^t = -(Am^t + Bp_1^t) \quad (9)$$

By Equation (9), the second parity symbol sequence $p_2$ can be generated by summing vectors $Am^t$ and $Bp_1^t$, thereby negating the need of sequential calculation. Therefore, if the second parity symbol sequence $p_2$ is generated in such a manner, it is easy to realize the encoding process in parallel processing (in other words, a rate of the encoding process can be increased).

The encoding apparatus according to the first embodiment generates the first parity symbol sequence $p_1$ and the second parity symbol sequence $p_2$ by following Equations (8) and (9) above. The encoding apparatus corresponds to the parity check matrix H shown in FIG. 6 and Equation (10) below:

$$H = \begin{pmatrix} A & B & I \\ C & D & E \end{pmatrix} \quad (10)$$

Matrix A is a matrix of qL rows×q(N−J) columns. Matrix B is a matrix of qL rows×q(J−L) columns. Matrix C is a matrix of q(J−L) rows×q(N−J) columns. Matrix D is a matrix of q(J−L) rows×q(J−L) columns. Matrix E is a matrix of q(J−L) rows×qL columns. From the view point of reducing calculation complexity, matrices A, B, C, D and E are preferably sparse matrices.

Typically, matrices A, B, C, D and E are formed by arranging (the number of rows×the number of columns) block matrices (i.e., matrices of q rows×q columns). In the following explanation, it is assumed that matrices A, B, C, D and E are formed by arranging (the number of rows×the number of columns) block matrices. More specifically, matrix A is formed by arranging L×(N−J) block matrices; matrix B is formed by arranging L×(J−L) block matrices; matrix C is formed by arranging (J−L)×(N−J) block matrices; matrix D is formed by arranging (J−L)×(J−L) block matrices; matrix E is formed by arranging (J−L)×L block matrices.

Each block matrix may be a non-zero matrix (preferably a sparse matrix) or may be a zero matrix. In terms of simple hardware configuration, a non-zero matrix as each block matrix may be a cyclic shift matrix of the identity matrix, i.e. a cyclic permutation matrix. Herein, among the cyclic shift matrices, a matrix having one non-zero element in each row is the most sparse cyclic shift matrix. In the following explanation, suppose each block matrix is a cyclic shift matrix of q rows×q columns including only one non-zero element in each row, or a zero matrix of q rows×q columns; in other words, suppose the parity check matrix H is a semi-cyclic shift matrix formed by arranging J×N block matrices.

A semi-cyclic shift matrix can be expressed using a fundamental matrix. A block matrix corresponding to an identity matrix of q rows×q columns corresponds to an element of 0 in the fundamental matrix. A block matrix corresponding to a matrix in which non-zero elements in each row is cyclically shifted to the right for i row(s) (i=1, 2, . . . , q−1) corresponds to an element i in the fundamental matrix. A block matrix of q rows×q columns of zero elements corresponds to an element ∞ in the fundamental matrix. FIG. 4 shows the parity check matrix H and the fundamental matrix $\Omega_H$ thereof. In the example shown in FIG. 4, q=3, J=5, N=6, L=3.

The encoding apparatus according to the present embodiment comprises an input unit for inputting a data symbol sequence containing q(N−J) symbols, and a generating unit for generating a codeword containing qN symbols that is obtained by adding the parity symbol sequence containing qJ symbols to the data symbol sequence.

The encoding apparatus 100 according to the present embodiment is shown in FIG. 1. The encoding apparatus 100 includes matrix calculation units 101, 102, 103 and 104 and vector addition unit 105. Matrix calculation units 101, 102, 103 and 104 and vector addition unit 105 correspond to the generating unit described above.

Matrix calculation units 101 and 102 generate a first parity symbol sequence $p_1$ based on Equation (8) above. Matrix calculation units 103 and 104 and vector addition unit 105 generate a second parity symbol sequence $p_2$ based on Equation (9) above.

Matrix calculation unit 101 inputs a data symbol sequence m from outside. Matrix calculation unit 101 multiplies the matrix (−EA+C) from the left side of the data symbol sequence $m^t$. In other words, matrix calculation unit 101 calculates a vector (matrix product) $v_1^t$ by following Equation (11) below. Matrix calculation unit 101 outputs vector $v_1^t$ to matrix calculation unit 102.

$$v_1^t = (-EA+C)m^t \quad (11)$$

Matrix calculation unit 102 inputs vector $v_1^t$ from matrix calculation unit 101. Matrix calculation unit 102 multiplies a matrix $\Psi^{-1}$ from the left side of vector $v_1^t$. In other words, matrix calculation unit 102 calculates a first parity symbol sequence $p_1^t$ by Equation (12) below. Matrix calculation unit 102 outputs the first parity symbol sequence $p_1$ from the apparatus, and outputs the same to matrix calculation unit 104.

$$p_1^t = \Psi^{-1} v_1^t \quad (12)$$

Matrix calculation unit 103 inputs the data symbol sequence m from outside. Matrix calculation unit 103 multiplies matrix A from the left side of the data symbol sequence m. In other words, matrix calculation unit 103 calculates a vector (matrix product) $v_2^t$ by Equation (13) below. Matrix calculation unit 103 outputs vector $v_2^t$ to vector addition unit 105. Matrix calculation unit 103 can operate concurrently matrix calculation units 101, 102 and 104, or may operate before or after the operation of those calculation units.

$$v_2^t = Am^t \quad (13)$$

Matrix calculation unit 104 inputs the first parity symbol sequence $p_1$ from matrix calculation unit 102. Matrix calculation unit 104 multiplies matrix B from the left side of the parity symbol sequence $p_1^t$. In other words, matrix calculation unit 104 calculates a vector (matrix product) $v_3^t$ by Equation (14) below. Matrix calculation unit 104 outputs vector $v_3^t$ to vector addition unit 105.

$$v_3^t = B p_1^t \quad (14)$$

Vector addition unit 105 inputs vector $v_2^t$ from matrix calculation unit 103, and inputs vector $v_3^t$ from matrix calculation unit 104. Vector addition unit 105 adds vector $v_2^t$ and vector $v_3^t$. In other words, vector addition unit 105 calculates the second parity symbol sequence $p_2$ by Equation (15) below. Vector addition unit 105 outputs the second parity symbol sequence $p_2$ from the apparatus.

$$p_2^t = v_2^t + v_3^t \quad (15)$$

Regarding Equation (12) above, $\Psi^{-1}$ is a matrix of $q(J-L)$ rows×$q(J-L)$ columns. The matrix $\Psi^{-1}$ is generally not a sparse matrix; thus, the calculation complexity of Equation (12) is not always low. Accordingly, it is preferable to reduce the calculation complexity of Equation (12) by setting L as large as possible in consideration of the characteristics of LDPC codes, while maintaining the characteristics of LDPC codes.

A possible maximum value of L can be determined by the following method. For example, there is at least one W that satisfies a condition that the total number of columns having at maximum W (W may be J, J−1, . . . , 1) elements other than ∞ (i.e., elements such as 0, 1, . . . , q−1) is at least (J−W+1) in a portion in the fundamental matrix $\Omega_H$ corresponding to the parity symbol sequence p. For such W, L can be set as J−W+1. In this case, if a minimum of W is Wmin, and a maximum of L is Lmax, Lmax=J−Wmin+1. In the example shown in FIG. 4, the above condition is satisfied when W=5, 4, 3. Accordingly, Lmax can be set as 3 (5×3+1).

It should be noted, as described above, that it is desirable to set L as great as possible in consideration of the characteristics of LDPC codes, since simply setting L at the greatest value may cause degradation of the characteristic of LDPC codes. For example, it is empirically known that a minimum number in a non-zero block matrix in each row of a parity check matrix that defines an LDPC code showing good characteristic in a region where a decoding error rate is 3 or more. Accordingly, for example, it is preferable to adopt W=3 to set L for an LDPC code to be applied to a storage system. In other words, it is desirable to design the first submatrix of qJ rows× qJ columns corresponding to a parity symbol sequence of the parity check matrix H includes a second submatrix of qJ rows×q(J−2) columns comprising an identity matrix of q(J−2) rows×q(J−2) columns and a non-zero matrix in which 2×(J−2) cyclic shift matrices are arranged.

Figure 3:
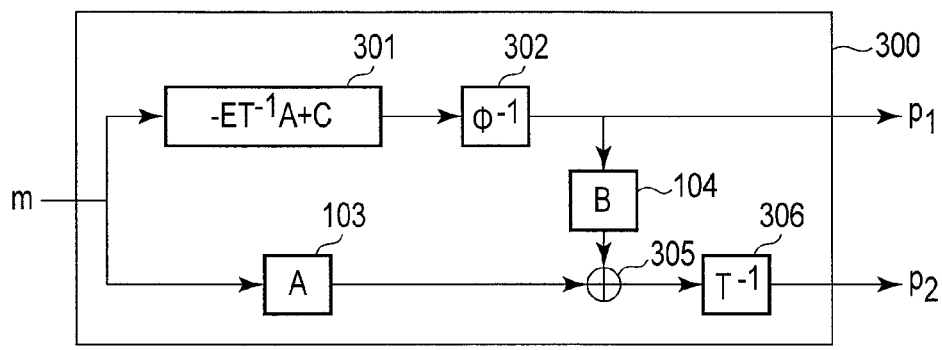
FIG. 3 is a block diagram showing an encoding apparatus in a comparative example.

The encoding apparatus 300 shown in FIG. 3 is a comparative example of the encoding apparatus 100. The encoding apparatus 300 comprises matrix calculation units 301, 302, 103, 104, 306 and a vector addition unit 305.

Matrix calculation units 301 and 302 generate a first parity symbol sequence $p_1$ by Equation (6) above. Matrix calculation units 103, 104 and 306 and vector addition unit 305 generate a second parity symbol sequence $p_2$ by Equation (7).

Matrix calculation unit 301 inputs a data symbol sequence m from outside. Matrix calculation unit 301 multiplies matrix $(-ET^{-1}A+C)$ from the left side of the data symbol sequence $m^t$. In other words, matrix calculation unit 301 calculates a vector (matrix product) $v_4^t$ by Equation (16) below. Matrix calculation unit 301 outputs vector $v_4^t$ to matrix calculation unit 302.

$$v_4^t = (-ET^{-1}A+C)m^t \quad (16)$$

Matrix calculation unit 302 inputs a vector $v_4^t$ from matrix calculation unit 301. Matrix calculation unit 302 multiplies a matrix $\phi^{-1}$ from the left side of vector $v_4^t$. In other words, matrix calculation unit 302 calculates the first parity symbol sequence $p_1^t$ in accordance with Equation (17) below. Matrix calculation unit 302 outputs the first parity symbol sequence $p_1$ from the apparatus and outputs the same to matrix calculation unit 104.

$$p_1^t = \Phi^{-1} v_4^t \quad (17)$$

Vector addition unit 305 inputs a vector $v_2^t$ from matrix calculation unit 103, and inputs a vector $v_3^t$ from matrix calculation unit 104. Vector addition unit 305 adds vector $v_2^t$ and vector $v_3^t$. In other words, vector addition unit 305 calculates a vector $v_5^t$ in accordance with Equation (18) below. Vector addition unit 305 outputs vector $v_5^t$ to matrix calculation unit 306.

$$v_5^t = v_2^t + v_3^t \quad (18)$$

Matrix calculation unit 306 inputs vector $v_5^t$ from vector addition unit 305. Matrix calculation unit 306 calculates a second parity symbol sequence $p_2^t$ in accordance with Equation (19) below. Since the matrix $T^{-1}$ is a lower triangular matrix, the calculation complexity can be reduced by sequential calculation. Matrix calculation unit 306 outputs the second parity symbol $p_2$ from the apparatus.

$$p_2^t = T^{-1} v_5^t \quad (19)$$

If the encoding apparatus 100 is compared to the encoding apparatus 100, the encoding apparatus 100 does not require sequential calculation, unlike matrix calculation unit 306. Accordingly, it is easier to realize the encoding process by performing the process concurrently (i.e., enhancing the rate of the encoding process) with the encoding apparatus 100 than with the encoding apparatus 300.

As explained above, the encoding apparatus according to the first embodiment generates a codeword using a parity check designed such that a submatrix corresponding to a parity symbol sequence includes an identity matrix of q rows×q columns. Thus, according to the encoding apparatus, the calculation complexity of the encoding process can be reduced, and the rate of the encoding process can be enhanced.

(Second Embodiment)

The encoding apparatus according to the second embodiment is different from that according to the first embodiment in terms of part of the parity check matrix. More specifically, the encoding apparatus according to the second embodiment corresponds to the parity check matrix H shown in FIG. 7 and Equation (20) below:

$$H = \begin{pmatrix} A & B & I \\ C & I & E \end{pmatrix} \quad (20)$$

The parity check matrix H indicated in Equation (20) corresponds to the parity check matrix H indicated in Equation (10), wherein the submatrix D is an identity matrix I. Further, the parity check matrix H indicated in Equation (20) satisfies Equation (21) below:

$$EB=0 \quad (21)$$

Accordingly, Equation (8) can be replaced with Equation (22) below:

$$P_1^t = (-EA+C)m^t \quad (22)$$

The encoding apparatus according to the present embodiment comprises an input unit for inputting a data symbol sequence having q(N−J) symbols and a generating unit for generating a codeword having qN symbols by adding the parity symbol sequence having qJ symbols to the data symbol sequence having q(N−J) symbols.

Figure 2:
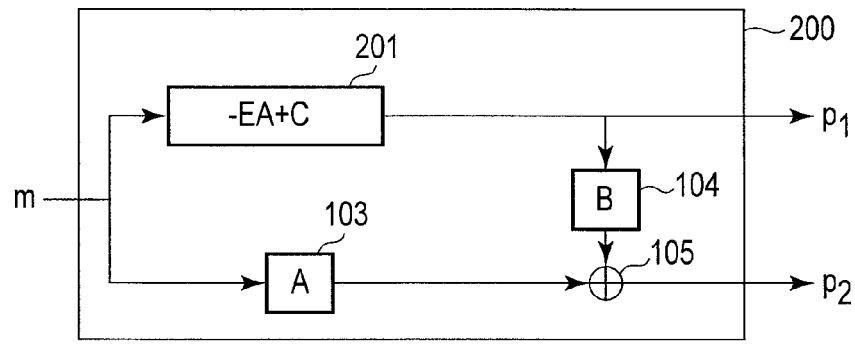
FIG. 2 is a block diagram showing an encoding apparatus according to the second embodiment.

FIG. 2 shows the encoding apparatus 200 according to the present embodiment. The encoding apparatus 200 includes matrix calculation units 201, 103 and 104 and a vector addition unit 105. Matrix calculation units 201, 103 and 104 and vector addition unit 105 correspond to the aforementioned generating unit.

Matrix calculation unit 201 generates a first parity symbol sequence $p_1$ by Equation (22). Matrix calculation units 103 and 104 and vector addition unit 105 generate a second parity symbol sequence $p_2$ by following Equation (9).

Matrix calculation unit 201 inputs a data symbol sequence m from outside. Matrix calculation unit 201 multiplies the matrix (−EA+C) from the left side of the data symbol sequence $m^t$. In other words, matrix calculation unit 201 calculates the first parity symbol sequence $p_1$ by following Equation (22). Matrix calculation unit 201 outputs the first parity symbol sequence $p_1$ from the apparatus and to matrix calculation unit 104.

Matrix calculation unit 103 is similar to or the same as the one described in the first embodiment; however, matrix calculation unit 103 may be operated concurrently with matrix calculation units 201 and 104, and may be operated before or after the operation of matrix calculation units 201 and 104.

According to the parity check matrix H that satisfies Equations (20) and (21) above, $\Psi^{-1} = (-EB+D)^{-1} = I$. The encoding apparatus 200 does not require matrix calculation using the matrix $\Psi^{-1}$ like the calculation shown in Equation (12). As the matrix $\Psi^{-1}$ is not generally a sparse matrix, as explained above, the calculation complexity of a matrix product including the matrix $\Psi^{-1}$ is not always low. Accordingly, the encoding apparatus 200 can omit the calculation shown in Equation (12), and thus, the calculation complexity of the encoding process can be effectively reduced.

In the following, the technique of designing matrices E and B that satisfy Equation (21) is described. The technique is not limitative, and matrices E, B that satisfy Equation (21) can be designed by adopting various techniques. For example, matrices E, B that satisfy Equation (21) can be designed by adopting the teachings from Manabu Hagiwara et al. "Quantum Quasi-Cyclic LDPC Codes" Proceedings in IEEE International Symposium on Information Theory (ISIT2007), pp. 806-810, 2007.

With the present technique, a cyclic shift matrix S of qM rows×qM columns and a cyclic shift matrix Q of qM rows×qM columns are used. Cyclic shift matrices S, Q are formed by arranging M×M block matrices having q rows×q columns. Each of the block matrices are a cyclic shift matrix or a zero matrix. Thus, fundamental matrices $\Omega s$, $\Omega_Q$ of cyclic shift matrices S, Q can be described as shown in Equation (23) below:

$$\Omega_S = \begin{pmatrix} s_0 & s_1 & \cdots & s_{M-1} \\ s_{M-1} & s_0 & \cdots & s_{M-2} \\ \vdots & \vdots & \ddots & \vdots \\ s_1 & s_2 & \cdots & s_0 \end{pmatrix} \quad (23)$$

$$\Omega_U = \begin{pmatrix} u_0 & u_1 & \cdots & u_{M-1} \\ u_{M-1} & u_0 & \cdots & u_{M-2} \\ \vdots & \vdots & \ddots & \vdots \\ u_1 & u_2 & \cdots & u_0 \end{pmatrix}$$

In Equation (23), elements $s_0, s_1, \ldots, s_{M-1}, u_0, u_1, \ldots, u_{M-1}$ are any of 0, 1, ..., q−1, or ∞. The element ∞ corresponds to a zero matrix of q rows×q columns. The elements 0, 1, ..., q−1 correspond to a cyclic shift matrix of q rows×q columns. The value of each element is a shift value of a corresponding cyclic shift matrix of q rows×q columns.

Matrices E and B can be expressed using those cyclic shift matrices S and U. Specifically, fundamental matrices $\Omega_E$, $\Omega_B$ of matrices E and B can be expressed by Equation (24) below:

$$\Omega_E = [\, \Omega_S \quad \Omega_U \,] \quad (24)$$

$$\Omega_B = \begin{bmatrix} \Omega_U \\ \Omega_S \end{bmatrix}$$

According to this technique, matrix E will be qM rows×2qM columns, and matrix B will be 2qM rows×qM columns. It is easy to confirm that matrices E and B designed by the present technique satisfy Equation (21). Further, since each row of matrix E (or each column of matrix B) is independent, the size of the matrix can be arbitrarily changed by removing a certain row (or column). In other words, the size of matrix E can be changed to (qM−P)×2qM, and the size of matrix B can be changed to 2qM×(qM−P). Herein, P is an integer (0≤P≤qM−1), desirably an integral multiple of q, considering that matrices E and B are designed as cyclic shift matrices.

The following Equations (25) and (26) illustrate fundamental matrices $\Omega_E$, $\Omega_B^t$ designed by the present technique when q=7, M=3:

$$\Omega_E = \begin{pmatrix} 1 & 2 & 4 & 3 & 6 & 5 \\ 4 & 1 & 2 & 5 & 3 & 6 \\ 2 & 4 & 1 & 6 & 5 & 3 \end{pmatrix} \quad (25)$$

$$\Omega_B = \begin{pmatrix} 3 & 6 & 5 \\ 5 & 3 & 6 \\ 6 & 5 & 3 \\ 1 & 2 & 4 \\ 4 & 1 & 2 \\ 2 & 4 & 1 \end{pmatrix} \quad (26)$$

As explained above, the encoding apparatus according to the second embodiment uses a parity check matrix which is designed so as to omit a part of matrix calculation required for generating a first parity symbol sequence at the encoding apparatus according to the first embodiment. Since the omitted part of the matrix calculation corresponds to a matrix product calculation generally including a matrix which is not sparse matrix, the calculation complexity is not always low. Therefore, with the encoding apparatus according to the second embodiment, the calculation complexity of the encoding process can be effectively reduced as compared to the encoding apparatus according to the first embodiment.

Figure 8:
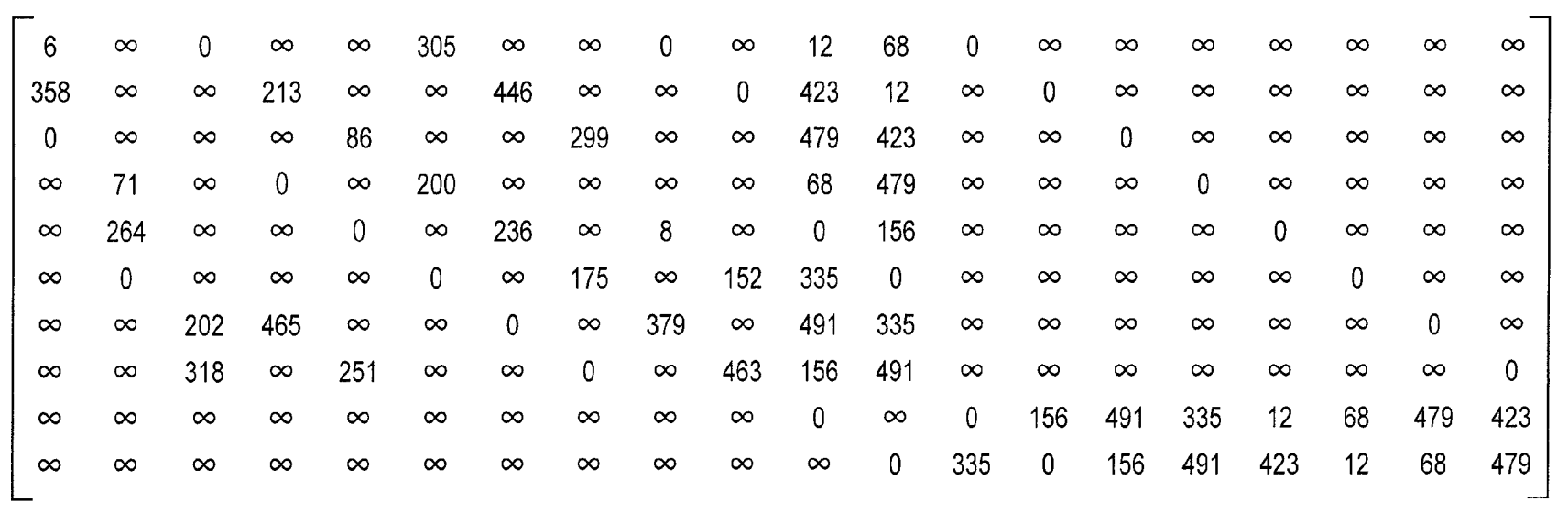

FIG. 8 shows the fundamental matrix of the parity check matrix used by the encoding apparatus according to the second embodiment. The fundamental matrix corresponds to a parity check matrix that defines an LDPC code having a half coding rate. As for this particular parity check matrix, q=493. In the LDPC code defined by the fundamental matrix the average number of adds required to generate one parity symbol (parity bit) is 6.2 times. Thus, it can be confirmed that the calculation complexity of the encoding is significantly reduced.

(Third Embodiment)

The encoding apparatus according to the first and the second embodiments is incorporated in, for example, a memory system and a communication system. The semiconductor memory system according to the third embodiment incorporates the encoding apparatus according to the first and second embodiments. Although detailed explanation is omitted, the encoding apparatus according to the first and second embodiments can be integrated in any kind of system that can utilize error correction code, such as a communication system, an optical storage system, a magnetic storage system, etc.

As shown in FIG. 5, the semiconductor memory system 500 according to the third embodiment includes an LDPC encoding unit 501, a non-volatile semiconductor memory 502, an LDPC decoding unit 503. The semiconductor memory system 500 may use an error correction code other than an LDPC code. For brevity, the functional unit that reads and writes data to the non-volatile semiconductor memory 502 is omitted in FIG. 5. In reality, the semiconductor memory system 500 may comprise such a functional unit as needed.

The LDPC encoding unit 501 corresponds to the encoding apparatus according to the first and second embodiments. The LDPC encoding unit 501 inputs data from a processing unit (not shown) in the preceding stage, and performs LDPC encoding process on each of the data symbol sequences that constitute the data. In other words, the LDPC encoding unit 501 adds a parity symbol sequence to a data symbol sequence to generate an LDPC code frame (i.e., an LDPC codeword). The LDPC encoding unit 501 generates page data by binding one or more LDPC code frame. The LDPC encoding unit 501 outputs the page data to the nonvolatile semiconductor memory 502.

As mentioned above, the LDPC encoding unit 501 corresponds to the encoding apparatus according to the first and second embodiments. Accordingly, the LDPC encoding unit 501 performs encoding process by utilizing the parity check matrix H as indicated in Equation (10) or (20) above (or a matrix that can be obtained by performing at least one of elementary row operation and elementary column operation on the parity check matrix H). In other words, the LDPC encoding unit 501 generates a first parity symbol sequence based on the data symbol sequence, and a second parity symbol sequence based on the first parity symbol sequence and the data symbol sequence.

The process of writing to the nonvolatile semiconductor memory 502 and reading therefrom is performed by a unit of page data. As explained above, page data is generated by binding one or more LDPC code frames. The size of each page data is dependent on the configuration of the nonvolatile semiconductor memory 502, but generally it is a few kilobytes. The nonvolatile semiconductor memory 502 comprises a plurality of memory cells. More specifically, the nonvolatile semiconductor memory 502 is realized by a flash memory having an array structure in which a plurality memory cells are NAND coupled, for example.

Two or more threshold voltages are assigned to each memory cell to store data in the size of one bit or more. A data amount that each memory cell can store is determined by a total number of threshold voltages assigned to each memory cell. For example, for a flash memory that stores two bits per cell, four thresholds in accordance with two-bit value patterns, 00, 01, 10 and 11, to each cell. Fluctuations in the threshold voltage of a memory cell may be caused by a capacitive coupling to a neighboring cell. The fluctuations are one of causes of error in read data.

The nonvolatile semiconductor memory 502 inputs page data generated by the LDPC encoding unit 501. The nonvolatile semiconductor memory 502 stores (writes) the page data in (to) memory cells. The nonvolatile semiconductor memory 502 reads and outputs the page data stored in the memory cell. As described above, it should be noted that the page data may contain errors caused by factors, such as the fluctuations in a threshold voltage, etc.

The LDPC decoding unit 503 inputs page data read by the nonvolatile semiconductor memory 502. The LDPC decoding unit 503 performs LDPC decoding process on each of the LDPC code frames included the page data.

The LDPC decoding process is realized by an iterative decoding algorithm that uses a parity check matrix. The iterative decoding algorithm is, for example, a sum-product algorithm or a min-sum algorithm.

The LDPC decoding unit 503, when no errors are found by parity checks (i.e., successful decoding), removes the parity symbol sequence from the temporary estimated word to generate a data symbol sequence, and outputs it to a signal processing unit (not shown) in the subsequent stage. In addition, when the number of trials of a decoding process reaches the maximum number of iterations (i.e., decoding fails), the LDPC decoding unit 503 may outputs a data symbol sequence to a signal processing unit (not shown) in the subsequent stage, or notifies a signal processing unit (not shown) in the subsequent stage of the failure in decoding.

The LDPC decoding unit 503 uses the parity check matrix H as indicated in Equation (10) or (20) above (or, a matrix that can be obtained by performing at least one of elementary row operation and elementary column operation on the parity check matrix H).

As explained above, the semiconductor memory system according to the third embodiment incorporates the encoding apparatus according to the first and second embodiments. According to the semiconductor memory system, the rate of the encoding process as a part of writing process can be enhanced.

The processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor memory, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An encoding apparatus, comprising:
   an input unit configured to input a data symbol sequence containing q(N−J) symbols (q, J, and N are integers, N>J>2); and
   a generation unit configured to generate a codeword containing qN symbols by adding a parity symbol sequence containing qJ symbols to the data symbol sequence,
   wherein the codeword satisfies parity check equations of a parity check matrix of qJ rows×qN columns,
   wherein a first submatrix of qJ rows×qJ columns that corresponds to the parity symbol sequence in the parity check matrix includes a second submatrix, the second submatrix comprising a first identity matrix of qL rows× qL columns (L is an integer, J>L) and a first non-zero matrix of q(J−L) rows×qL columns, and
   wherein the parity check matrix is formed by arranging J×N block matrices of q rows×q columns, each of the block matrices being one of a cyclic shift matrix and a zero matrix.

2. The apparatus according to claim 1, wherein the first submatrix further includes a third submatrix of qJ rows×q(J−L) columns comprising a second non-zero matrix of qL rows× q(J−L) columns and a second identity matrix of q(J−L) rows× q(J−L) columns, and a matrix product of the first non-zero matrix and the second non-zero matrix is a zero matrix.

3. The apparatus according to claim 2, wherein the parity symbol sequence comprises a first partial parity symbol sequence containing q(J−L) symbols and a second partial parity symbol sequence containing qL symbols, the first partial parity symbol sequence is generated based on the data symbol sequence, and the second partial parity symbol sting is generated based on the first partial parity symbol sequence and the data symbol sequence.

4. The apparatus according to claim 2, wherein L=J−2, the first non-zero matrix is formed by arranging 2×(J−2) block matrices of q rows×q columns, and each of the block matrices is a non-zero matrix.

5. The apparatus according to claim 1, wherein the parity symbol sequence comprises a first partial parity symbol sequence containing q(J−L) symbols and a second partial parity symbol sequence containing qL symbols, the first partial parity symbol sequence is generated based on the data symbol sequence, and the second partial parity symbol sequence is generated based on the first partial parity symbol sequence and the data symbol sequence.

6. The apparatus according to claim 1, wherein L=J−2, the first non-zero matrix is formed by arranging 2×(J−2) block matrices of q rows×q columns, and each of the block matrices is a non-zero matrix.

7. A semiconductor memory system comprising:
   the apparatus according to claim 1; and
   a semiconductor memory configured to store the codeword.

8. A control method for an encoding apparatus, the control method comprising:
   inputting a data symbol sequence containing q(N−J) symbols (q, J, and N are integers, N>J>2);
   generating a codeword containing qN symbols by adding a parity symbol sequence containing qJ symbols to the data symbol sequence; and
   storing the qN symbols in a non-volatile semiconductor memory,
   wherein the codeword satisfies parity check equations of a parity check matrix of qJ rows×qN columns,
   wherein a first submatrix of qJ rows×qJ columns that corresponds to the parity symbol sequence in the parity check matrix includes a second submatrix, the second submatrix comprising a first identity matrix of qL rows× qL columns (L is an integer, J>L) and a first non-zero matrix of q(J−L) rows×qL columns, and
   wherein the parity check matrix is formed by arranging J×N block matrices of q rows×q columns, each of the block matrices being one of a cyclic shift matrix and a zero matrix.

9. The method according to claim 8, wherein the first submatrix further includes a third submatrix of qJ rows×q(J−L) columns comprising a second non-zero matrix of qL rows× q(J−L) columns and a second identity matrix of q(J−L) rows× q(J−L) columns, and a matrix product of the first non-zero matrix and the second non-zero matrix is a zero matrix.

10. The method according to claim 8, wherein the parity symbol sequence comprises a first partial parity symbol sequence containing q(J−L) symbols and a second partial parity symbol sequence containing qL symbols, the first partial parity symbol sequence is generated based on the data symbol sequence, and the second partial parity symbol sting is generated based on the first partial parity symbol sequence and the data symbol sequence.

11. The method according to claim 8, wherein L=J−2, the first non-zero matrix is formed by arranging 2×(J−2) block matrices of q rows×q columns, and each of the block matrices is a non-zero matrix.

* * * * *